(12) United States Patent
Cheng

(10) Patent No.: US 9,881,792 B2
(45) Date of Patent: Jan. 30, 2018

(54) PROCESSES FOR SHAPING NANOMATERIALS

(71) Applicant: Purdue Research Foundation, West Lafayette, IN (US)

(72) Inventor: Gary J. Cheng, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/447,734

(22) Filed: Mar. 2, 2017

(65) Prior Publication Data

US 2017/0256406 A1 Sep. 7, 2017

Related U.S. Application Data

(60) Provisional application No. 62/302,503, filed on Mar. 2, 2016, provisional application No. 62/302,369, filed on Mar. 2, 2016.

(51) Int. Cl.
 *B82Y 30/00* (2011.01)
 *H01L 21/02* (2006.01)
 *H01L 21/268* (2006.01)
 *B82B 3/00* (2006.01)

(52) U.S. Cl.
 CPC ........ *H01L 21/02664* (2013.01); *B82B 3/008* (2013.01); *H01L 21/02527* (2013.01); *H01L 21/02532* (2013.01); *H01L 21/02568* (2013.01); *H01L 21/02603* (2013.01); *H01L 21/02653* (2013.01); *H01L 21/268* (2013.01)

(58) Field of Classification Search
 CPC ............... H01L 21/0266; H01L 21/268; H01L 21/02653; H01L 21/0252; H01L 21/026
 See application file for complete search history.

(56) References Cited

U.S. PATENT DOCUMENTS

2015/0357070 A1* 12/2015 Reece ....................... B05C 9/12
 427/555
2016/0250712 A1 9/2016 Cheng

* cited by examiner

*Primary Examiner* — Dung Le
(74) *Attorney, Agent, or Firm* — Hartman Global IP Law; Gary M. Hartman; Domenica N. S. Hartman

(57) ABSTRACT

Processes for shaping one- and two-dimensional nanomaterials, and thereby inducing local strains therein preferably to control one or more of their material properties. The processes include providing a substrate comprising a three-dimensional surface feature thereon, locating a nanomaterial on the substrate and over the surface feature, and directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween.

20 Claims, 14 Drawing Sheets

PROCESSES FOR SHAPING NANOMATERIALS

CROSS REFERENCE TO RELATED APPLICATIONS

This application claims the benefit of U.S. Provisional Application Nos. 62/302,503 and 62/302,369, both filed Mar. 2, 2016, the contents of which are incorporated herein by reference.

BACKGROUND OF THE INVENTION

The present invention generally relates to nanomaterials. The invention particularly relates to one- and two-dimensional nanomaterials and to methods for their processing.

Nanomaterials are the subject of significant research across a broad spectrum of industries. As used herein, the term "nanomaterials" refers to materials with all dimensions being nanoscale (as nonlimiting examples, quantum dots, nanoparticles, dendrimers, nanocapsules, Fullerenes, nanoclusters, and nanodispersions) (zero-dimensional (0D) nanomaterials), materials with two dimensions being nanoscale and the third dimension being greater than nanoscale (as nonlimiting examples, nanofibers, nanotubes, nanowires, and nanorods) (one-dimensional (1D) nanomaterials), materials with one dimension (thickness) being nanoscale and other dimensions being greater than nanoscale (as nonlimiting examples, nanosheets, thin-films, and nanomembranes) (two-dimensional (2D) nanomaterials), and materials that have at least one nanoscale dimension (i.e., 0D, 1D, and/or 2D nanomaterials) but have been deformed or otherwise shaped so that all exterior dimensions are greater than nanoscale (three-dimensional (3D) nanomaterials). "Nanoscale" is defined herein as dimensions of up to 100 nanometers, e.g., 0.1-100 nm.

One- and two-dimensional nanomaterials have attracted a great deal of research interest due to their unique mechanical, electrical, and optical properties. For example, the ability to change the shape of a nanowire (NW) provides means for fundamental studies in strain engineering, electronic transport, mechanical properties, band structure, quantum properties, etc. However, current NW processing techniques cannot perform complicated shape changes and are limited to treating a single nanowire at a time.

Nanomembranes (NMs) are flexible, readily transferable, stackable, and conformable to a wide range of shapes (tubes, spirals, ribbons, wires, etc.) via appropriate strain engineering and patterning. Graphene in particular has attracted attention due to its structural perfection, low density, excellent electrical and thermal properties, electron mobility, excellent mechanical properties, etc. However, due to having zero band gaps, unpatterned graphene has limited functionality. One approach has been developed that produces graphene nanoribbons and dots to increase band gaps, but reliability, scalability, and quality remain issues for graphene patterning.

In view of the above, it can be appreciated that there is an ongoing desire to improve the processing of nanomaterials, and that it would be desirable if processes were available that were capable of controlling local strains in these materials in order to affect their properties.

BRIEF DESCRIPTION OF THE INVENTION

The present invention provides processes for shaping one- and two-dimensional nanomaterials, including but not limited to nanowires, nanosheets, and nanomembranes, and thereby induce local strains therein to control one or more of their material properties.

According to one aspect of the invention, a process is provided that includes providing a substrate comprising a three-dimensional surface feature thereon formed, locating a nanomaterial on the substrate and over the surface feature, directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween, and controlling the deformation of the nanomaterial to tunably modify a material property of the nanomaterial.

According to another aspect of the invention, a process is provided that includes providing a substrate comprising a three-dimensional surface feature thereon, locating a one-dimensional nanomaterial on the substrate and over the surface feature, and directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween without causing fracture in the nanomaterial.

Technical effects of the processes described above preferably include the capability of selectively modifying the shape of 1D and 2D nanomaterials, and inducing strains therein to optionally control one or more properties of the nanomaterials.

Other aspects and advantages of this invention will be further appreciated from the following detailed description.

DETAILED DESCRIPTION OF THE INVENTION

The present invention provides processes for shaping 1D and 2D nanomaterials using laser or other high speed intensive optical source processing systems, referred to herein as laser shock strain engineering (LSSE) processes. In particular, laser shock pressure can be employed to perform various forming approaches, including but not limited to conformal shaping, uniform bending, cutting, and lateral compression, preferably without unintentionally fracturing or cracking the nanomaterial. Such capability can be used to create nanomaterials with tunable shapes, allowing for the accommodation of various structural requirements, including flexible electronics. Such a capability can also be used to tunably change various properties of nanomaterials, for example, electrical, chemical, and optical properties, which may provide opportunities for developing miniature devices, for example, for use in electronics. According to a nonlimiting aspect of the invention, local strains may be induced in nanomaterials to increase the band gap of the material (energy range in a solid where no electron states exist). An additional nonlimiting aspect of the invention is the capability of inducing local strains in 2D nanomaterials to generate and produce 3D nanomaterials or otherwise increase the nanoscale dimension of the 2D nanomaterials.

Figure 1:
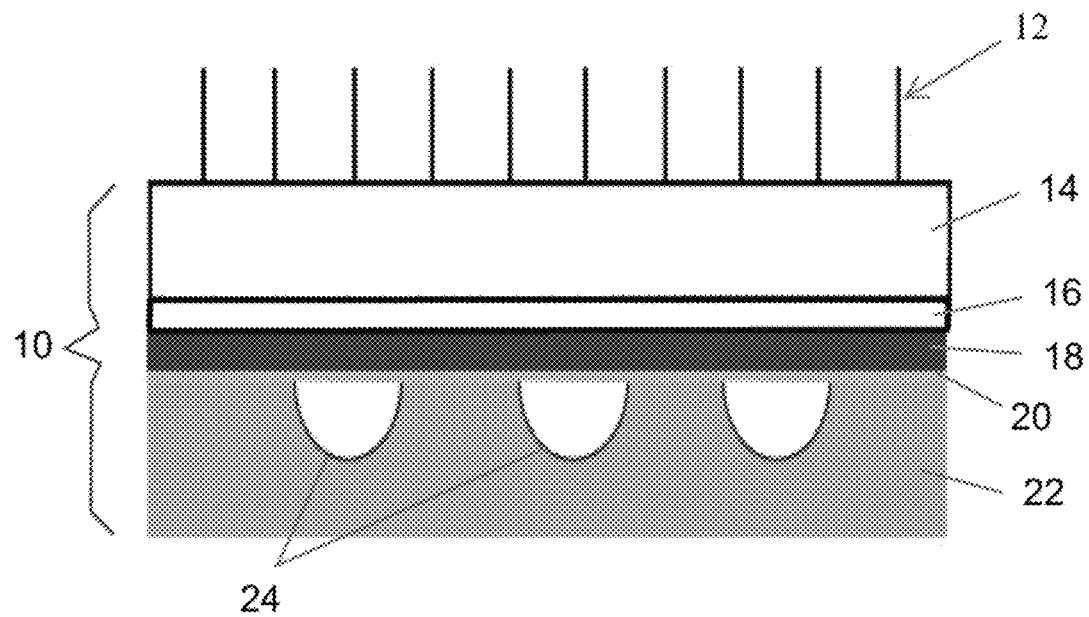
FIG. 1 schematically represents a laser shock strain engineering (LSSE) process wherein a laser beam is directed toward a layer stack comprising one or more nanomaterials on a substrate in accordance with a first nonlimiting embodiment of the invention.

The LSSE process employs laser shock pressure to tightly integrate 1D or 2D nanomaterials onto a substrate having one or more 3D surface features. As used herein, "3D surface feature" and "surface feature" are terms used to refer to any structure, shape, void, cavity, etc., such as but not limited to dots, protrusions, depressions, channels (trenches), etc., having any dimensions. Although preferred but nonlimiting embodiments herein are described as including substrates with 3D surface features thereon having at least one dimension of 100 nanometers or less (nanoscale), it is within the scope that the 3D surface features may have all dimensions greater than 100 nanometers. As a nonlimiting example, 3D surface features could have dimensions in the range of 10 nm to a few millimeters, including specific nonlimiting examples of 10 to 100 nm and 1 to 100 μm. Preferably, the aspect ratio (i.e., ratio of its sizes in different dimensions; e.g., width to depth of a channel) of the 3D surface features is in the range of about five to thirty percent, depending on the materials and application. The term "structured" is used to describe a surface or area in which one or more 3D surface features have been created. The surface features may be formed by various material additive and removal processes, such as but not limited to electron beam lithography (EBL) and focused ion beam (FIB) milling. The LSSE process can be performed at room temperature (e.g., 20-25° C.), and laser pressure can be applied for as little as a few nanoseconds. Due to extreme laser shock pressures, 1D or 2D nanomaterials overlying the substrate can conform in shape to and become tightly integrated with the surface features thereof. FIG. 1 schematically represents an LSSE process in accordance with a first nonlimiting embodiment of the invention. The process includes directing a laser beam 12 towards a layer stack 10 such that the beam 12 travels through a transparent confinement layer 14 (e.g., glass) to irradiate an ablative layer 16 (e.g., graphite). Beneath the ablative layer 16 is a thin metallic layer 18 (e.g., aluminum), which in turn overlies a nanomaterial layer 20, all of which is supported on a substrate 22. The nanomaterial layer 20 may be formed of one or more 1D or 2D nanomaterials. The substrate 22 includes 3D surface features thereon, in this instance channels 24.

Figure 2:
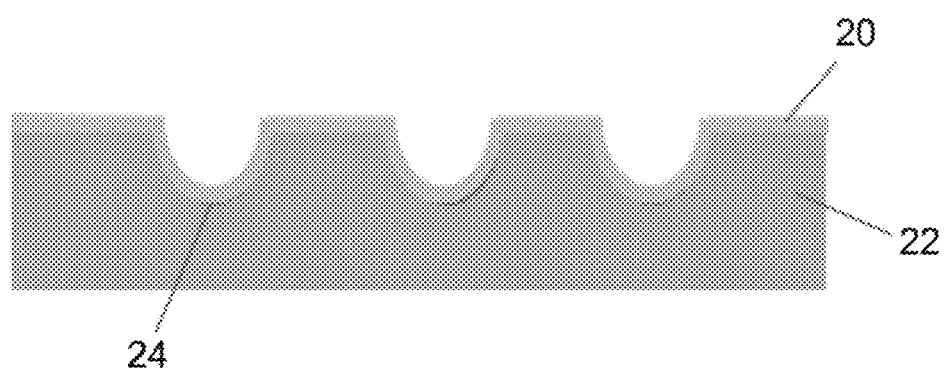
FIG. 2 schematically represents the substrate and nanomaterial(s) of FIG. 1 after application of laser shock pressure.

When a laser pulse is transmitted through the confinement layer 14, the ablative layer 16 may be ablated, vaporized, and ionized into plasma. The expansion of the plasma is confined by and bounces off by the confinement layer 14 generating a shock wave which provides a strong momentum to deform the nanomaterial layer 20 and cause it to at least partially if not completely conform to the surface features (channels 24) of the substrate 22. The metallic layer 18 positioned between the ablative layer 16 and the nanomaterial layer 20 conducts heat away from the nanomaterial layer 20 and prevents direct contact of ionized plasma with the nanomaterial layer 20, which promotes the efficiency of transferring the shock pressure onto the nanomaterial layer 20. An X-Y stage may be used to move a processing stage having the stack 10 thereon relative to the laser beam 12 such that the nanomaterial layer 20 may be treated with the laser beam 12 at multiple locations if desired. After the impact of the laser shock pressure, the nanomaterial layer 20 is preferably sufficiently deformed to at least partially if not completely conform to the surface features and firmly attach to the surface of the substrate 22, including surfaces of the surface features and unstructured (e.g., flat) surfaces therebetween. The metallic layer 18, ablative layer 16 (if remaining), and transparent layer 14 may be removed. FIG. 2 schematically represents the substrate 22 and nanomaterial layer 20 after laser shock pressure has been applied. As represented, the nanomaterial layer 20 has entirely conformed to the shape of the substrate 22 and is tightly adhered to inner concave surfaces of the channels 24.

Figure 3:
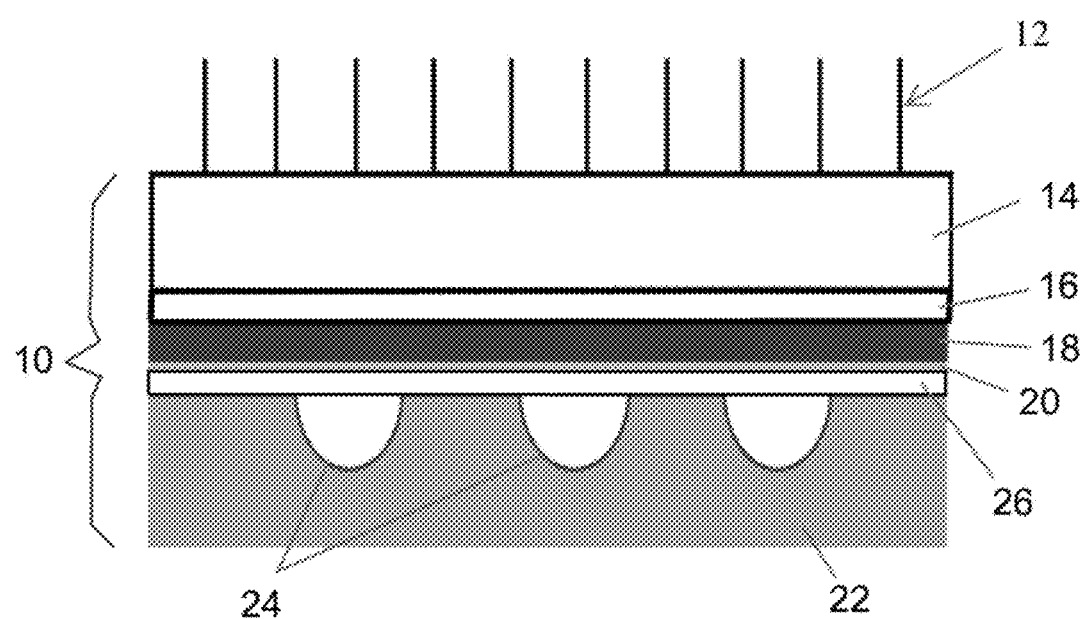
FIG. 3 schematically represents the layer stack of FIG. 1 as comprising an optional intermediate layer between the substrate and nanomaterial(s).

It is within the scope of the invention that the layer stack 10 represented in FIG. 1 and the resulting product represented in FIG. 2 may include additional layers depending on the application. For example, if the nanomaterial layer 20 is formed of one or more nanowires, an intermediate layer 26 may be located between the nanomaterial layer 20 and the substrate 22, as represented in FIG. 3. In this embodiment, laser shock pressure may integrate both the nanomaterial layer 20 and the intermediate layer 26 on the surface of the substrate 22. The intermediate layer 26 may be configured to assist in adhering the nanomaterial layer 20 to the substrate 22 and/or maintaining the strained structure of the nanomaterial layer 20. In addition, the intermediate layer 26 may act as a cushion under a relatively more brittle nanomaterial layer 20 to promote uniform deformation thereof.

The LSSE process may be used to deform and shape 1D and 2D nanomaterials (e.g., nanomaterial layer 20), nonlimiting examples including nanofibers, nanotubes, nanowires, nanorods, nanosheets, thin-films, and nanomembranes. The nanomaterials may be formed of various materials, nonlimiting examples including various metallic and semiconducting materials. Specific nonlimiting examples include gold, silver, or germanium nanowires, and silicon graphene, or boron nitride (BN) nanomembranes.

Because the laser intensity determines the final laser shock pressure, controlled application of a desired pressure, for example, several GPa, is possible. Other laser parameters, including power (intensity), duration, laser beam area, and wavelength, can be varied to suit the needs of a particular application, and thus a unique set of laser parameters can be employed to accurately achieve laser shock pressure levels needed to integrate nanomaterials to a surface feature of particular interest. Nonlimiting examples of parameters believed to be suitable for LSSE include laser beam intensity ranges from about 0.1 GW/cm$^2$ to 100 GW/cm$^2$ (for example, 0.1-10 GW/cm$^2$), laser beam pulse duration from about five femtoseconds to 100 nanoseconds, and a tunable magnitude of the shock pressure from about 200 MPa to 100 GPa (for example, 200 MPa to 10 GPa).

Nonlimiting embodiments of the invention will now be described in reference to experimental investigations leading up to the invention.

In one experimental investigation, germanium nanowires (GeNWs) were formed and applied to a silicon (Si) substrate, shaped using laser shock pressure, and then analyzed to investigate the effects of varying individual parameters of the LSSE process. The GeNWs were grown by a vapor-liquid-solid (VLS) mechanism in a chemical vapor deposition (CVD) chamber. In brief, a temporary substrate was thoroughly etched with a buffered hydrogen fluoride (HF) solution before any growth commenced to remove a surface oxide layer thereon. A well-mixed solution containing gold colloidal nanoparticles (AuNPs) and 10% HF/H$_2$O was then dispersed on the temporary substrate. The temporary substrate was then rinsed, dried, and loaded in the CVD chamber. The temporary substrate was then annealed at temperatures in the range of 280 to 400° C. for about five minutes in flowing hydrogen at pressure of 100 Torr. The duration between the particle deposition and the onset of annealing was approximately 10 minutes. Post annealing, GeNW growth was carried out using a mixture of GeH$_4$ (10 sccm; 10% diluted in hydrogen) and 40 sccm of hydrogen at a total pressure of 100 Torr and a substrate temperature of 280° C. Growth took place for about 40 minutes.

Figure 4:
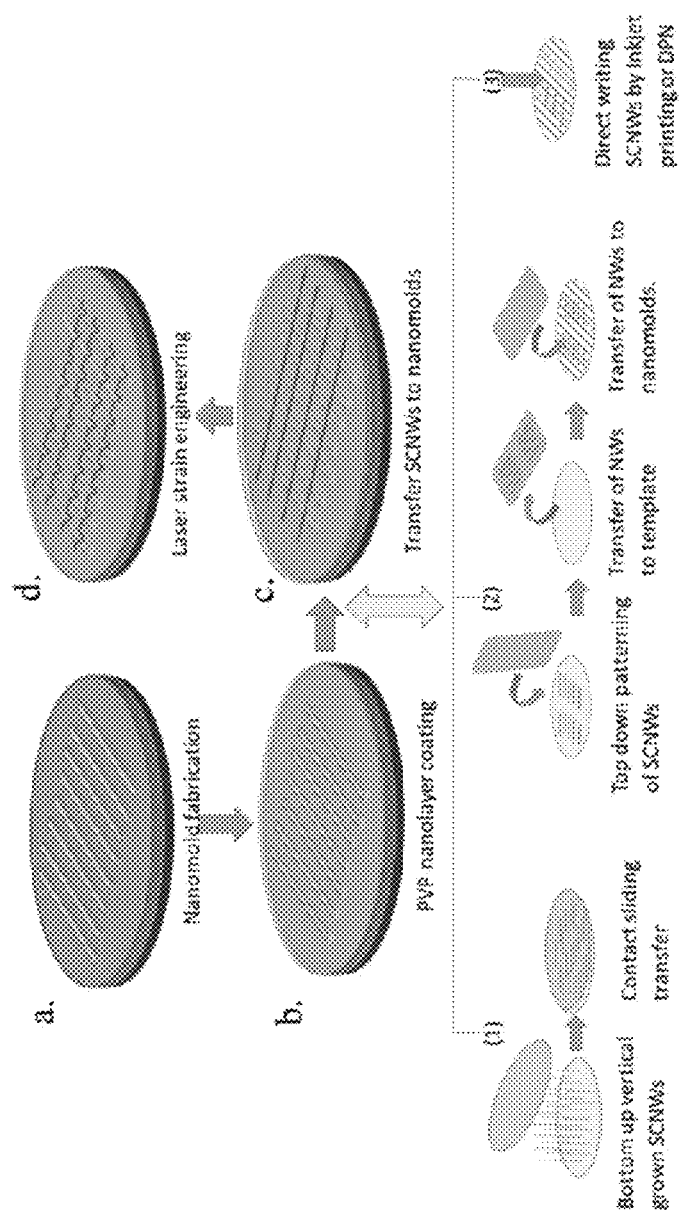
FIG. 4 schematically represents process steps that were performed to produce test samples for an experimental investigation leading to certain aspects of the present invention. A silicon (Si) wafer was patterned with an array of trenches (image a), coated with a polymer (image b), germanium nanowires (GeNWs) were aligned with and transferred to the patterned Si wafer (images c), and then an LSSE process was performed on a layer stack comprising the nanowires (e.g., FIG. 3) to result in a final product (image d). The GeNWs can be transferred via various methods, such as but not limited to a sliding method (image 1), a top down method (image 2), or a direct writing method (image 3).

Arrays of nanoscale channels were fabricated on a silicon (Si) wafer using electron beam lithography, resulting in an Si substrate schematically represented in image (a) of FIG. 4. A thin layer of a polymer material (Polyvinylpyrrolidone (PVP)) was dip-coated onto the surface of the Si Substrate (image (b) of FIG. 4). The resulting intermediate (polymer) layer was intended to not only soften the curvatures of the Si substrate, but also to assist in the transfer of the GeNWs from the temporary substrate to the Si substrate. In addition, the intermediate layer assisted in protecting the GeNWs from being damaged by the strong laser shock pressures during the LSSE process. Other polymer materials having similar mechanical behavior, such as polyvinyl alcohol (PVA), could be substituted for the PVP. In addition, it is foreseeable that an intermediate layer can be entirely omitted. After preparation of the Si substrate was finished, the GeNWs were transferred onto the Si substrate by a direct printing process.

The temporary substrate (donor) with grown GeNWs thereon was contacted against the Si substrate (acceptor) such that the GeNWs contacted the arrays of nanoscale channels on the Si substrate, and then the temporary substrate was slid in a direction perpendicular to the longitudinal direction of the channels while applying mild pressure (schematically represented in image (1) of FIG. 4; alternative methods are represented in images (2) and (3)). During this printing process, the GeNWs were transferred to the Si substrate with their alignment along the sliding direction, resulting in laterally aligned GeNWs suspended over the channels (image (c) of FIG. 4). An LSSE process was carried out on the GeNWs according to the arrangement represented in FIG. 3.

The laser source used was a short pulsed Q-switch Nd-YAG laser (Continuum® Surelite III). The laser beam employed in the present experiment had a Gaussian distribution and the pulse width was 10 ns. A focusing lens was used to control the beam size. The beam diameter used was 4 mm, which was calibrated by a photosensitive paper (Kodak Linagraph, type: 1895). Clinical glass slide was utilized as the confining media, and aerosol graphite painting (Asbury Carbons, USA) was sprayed on 4 μm thick aluminum foil (Lebow Company Inc, Bellevue, Wash.) as the ablative coating. The thickness of the ablative coating was in the range of about one to ten micrometers. The LSSE process bent the GeNWs into the channels located therebelow and firmly attached thereto, yielding the wavy structure represented in image (d) of FIG. 4. The laser intensities used on the GeNWs were relatively small, for example, less than 0.2 GW/cm², corresponding to shock pressure values of less than 0.66 GPa.

To validate the elastic/plastic nature of laser shock induced straining of GeNWs, the PVP cushion layer was dissolved in alcohol and the images of the freestanding GeNWs were captured. Several parametric experiments were carried out to investigate which experimental parameters are crucial and which are not so important. For example, parameters such as (a) laser pressure, (b) trench width, and (c) GeNW diameter were varied keeping other parameters constant. The maximum deformation depth was measured and strains present in GeNWs were calculated. The average axial strain was determined by the formula $$\epsilon_a = (L - L_0)/L_0$$

where, $L_0$ and $L$ are original and deformed segment length of the GeNWs along the cavities in the Si substrate. The average bending strain was estimated by the formula:

$$\epsilon_b = r/(r+R)$$

where, r and R are radiuses of the nanowires and the bending curvature, respectively. Total average strain was calculated by adding the two components of strain. Laser shock induced bending of the GeNWs was monitored by various microscopy techniques such as field emission scanning electron microscopy (FESEM), atomic force microscopy (AFM), and transmission electron microscopy (TEM). Focused ion beam (FIB) milling was employed for achieving cross-sectional high-resolution TEM images. Selected area electron diffraction was also carried out on the GeNWs samples subsequent laser shock induced bending.

Figure 5:
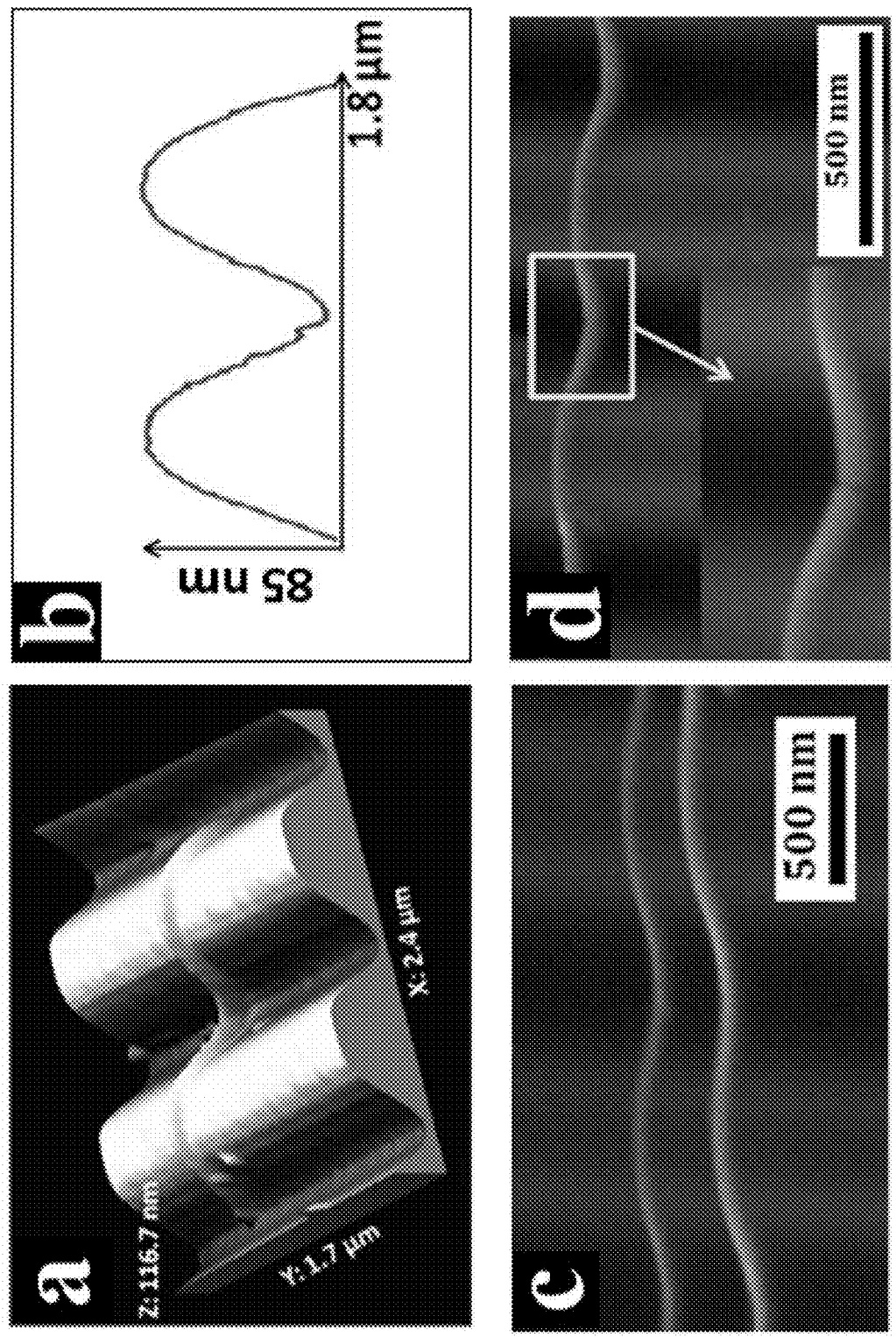
FIG. 5 includes various images showing or representing a test sample produced during investigations leading to certain aspects of the present invention. The sample includes a substrate having trenches formed thereon and a germanium nanowire deformed via LSSE to conform to the trenches. Images (a) and (b) are an atomic force microscopy (AFM) image and line profile, respectively, of the sample. Images (c) and (d) are field emission scanning electron microscopy (FESEM) images of germanium nanowires shaped at a laser shock pressure of about 940 MPa and 1000 MPa, respectively.

Images (a) and (b) of FIG. 5 show an AFM image and line profile, respectively, of a representative sample. Image (c) is an FESEM image of a GeNW shaped at a laser pressure of 940 MPa. GeNWs with the same diameter exhibited deformation depths that were relative to the width of the channels of the Si substrate, indicating that channel width affected shaping of the GeNWs.

Once the induced deformation was larger than the maximum the nanowire could withstand, fractures were observed. Image (d) of FIG. 5 is an FESEM image of a representative GeNW having the same diameter as those presented in image (c), but shaped at an increased laser pressure of 1000 MPa. Fractures are observed at two positions of the bent GeNWs, one at the center of bent part which is the largest deflection point, and the other at the end of the free suspended part, which is the joint place of the channel and GeNW, where the nanowire starts to turn and bend down. Thus, the center and the end positions of the bent NWs experienced the highest local strain during the process.

Figure 6:
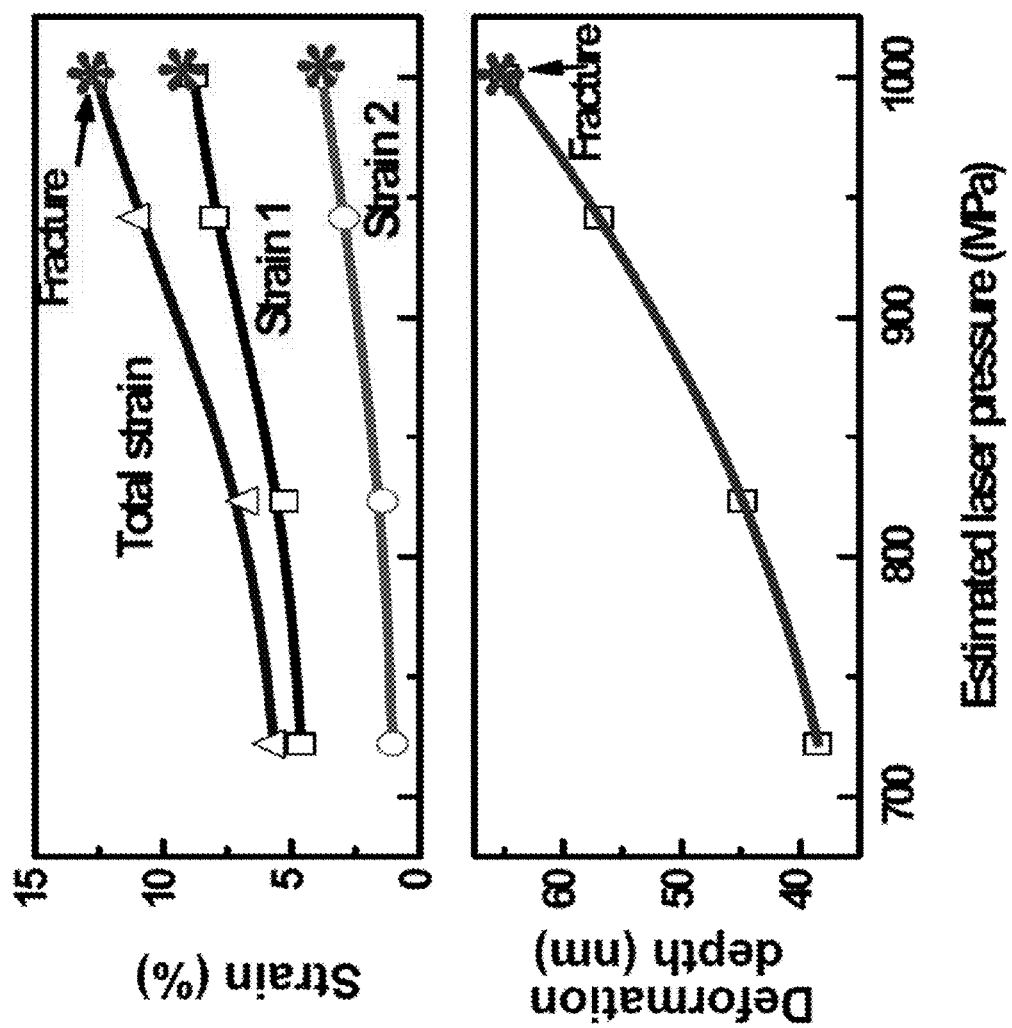
FIGS. 6, 7, and 8 represent experimental results of the effect of laser shock pressure, trench width, and nanowire diameter, respectively, on strain and deformation depth of a germanium nanowire on a patterned substrate.
Figure 7:
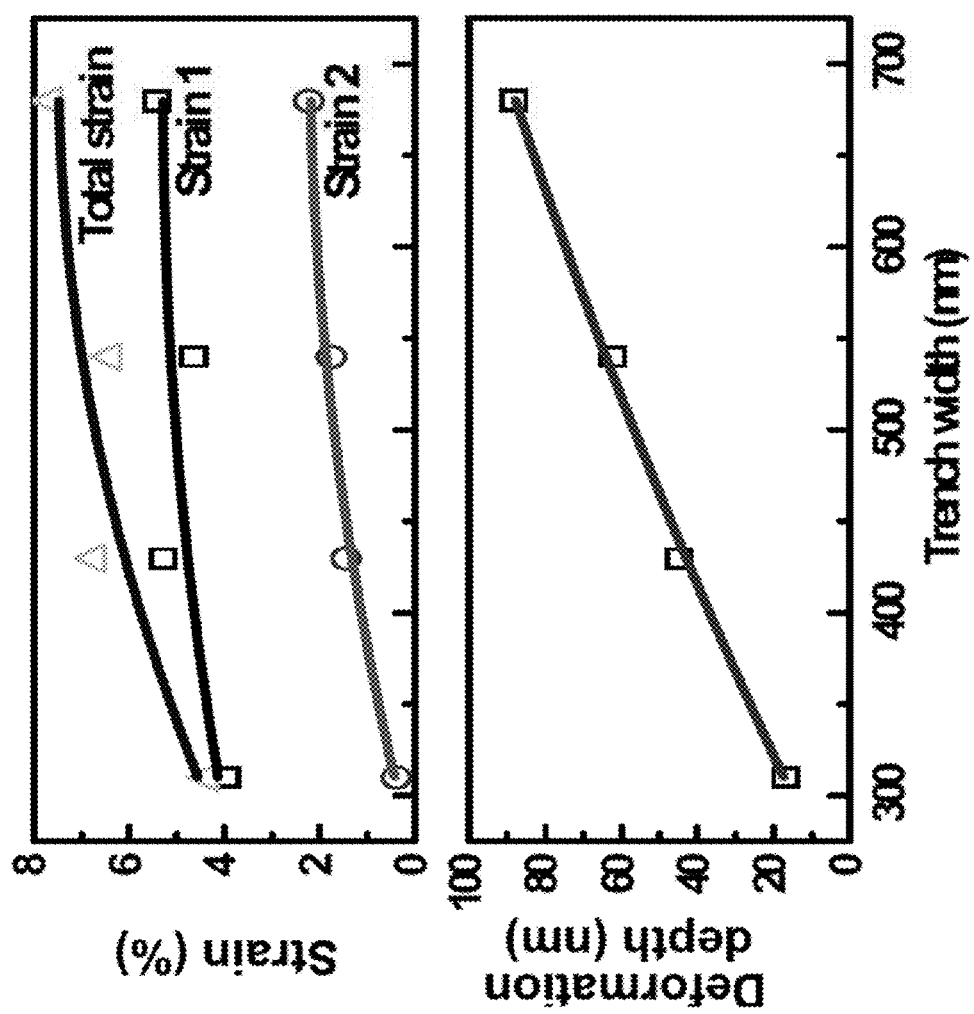
Figure 8:
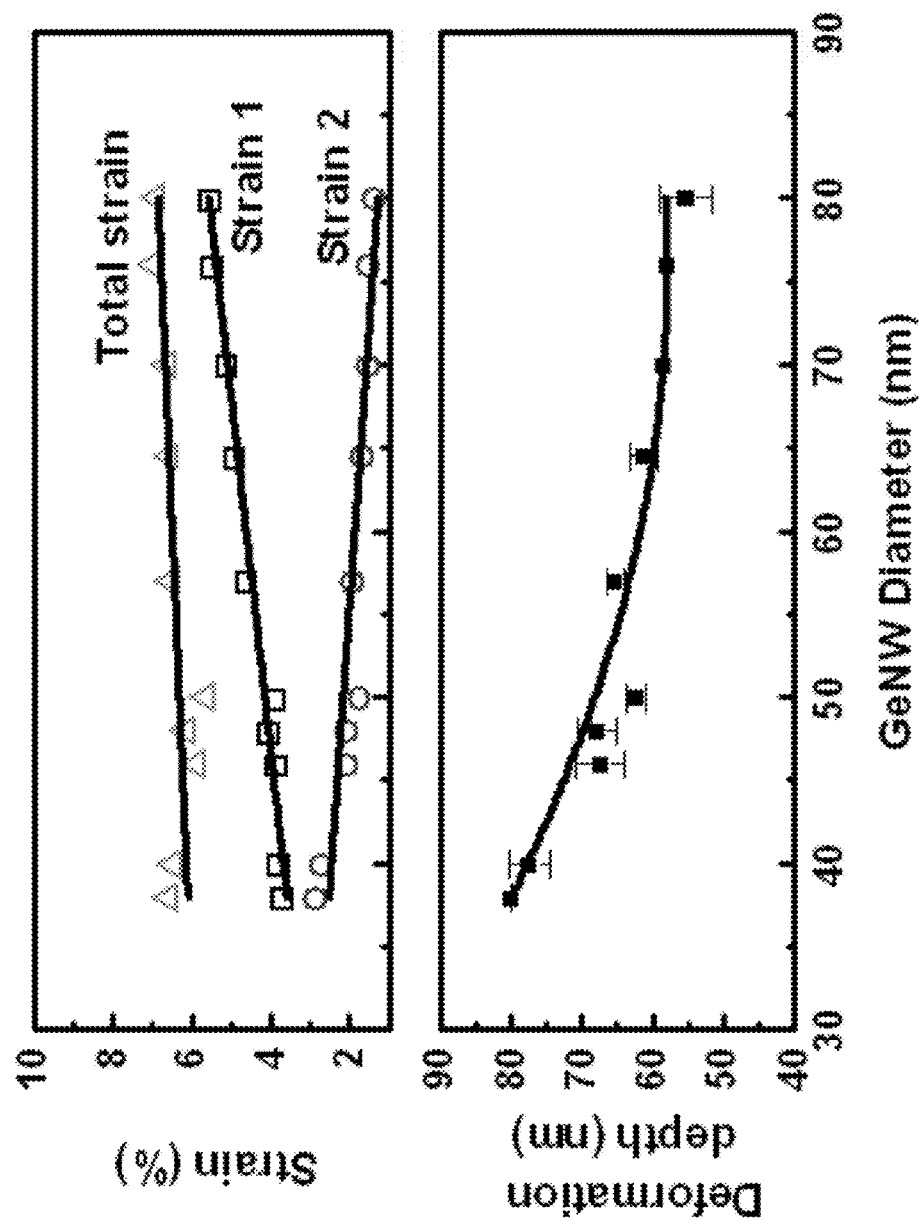
Figure 9:
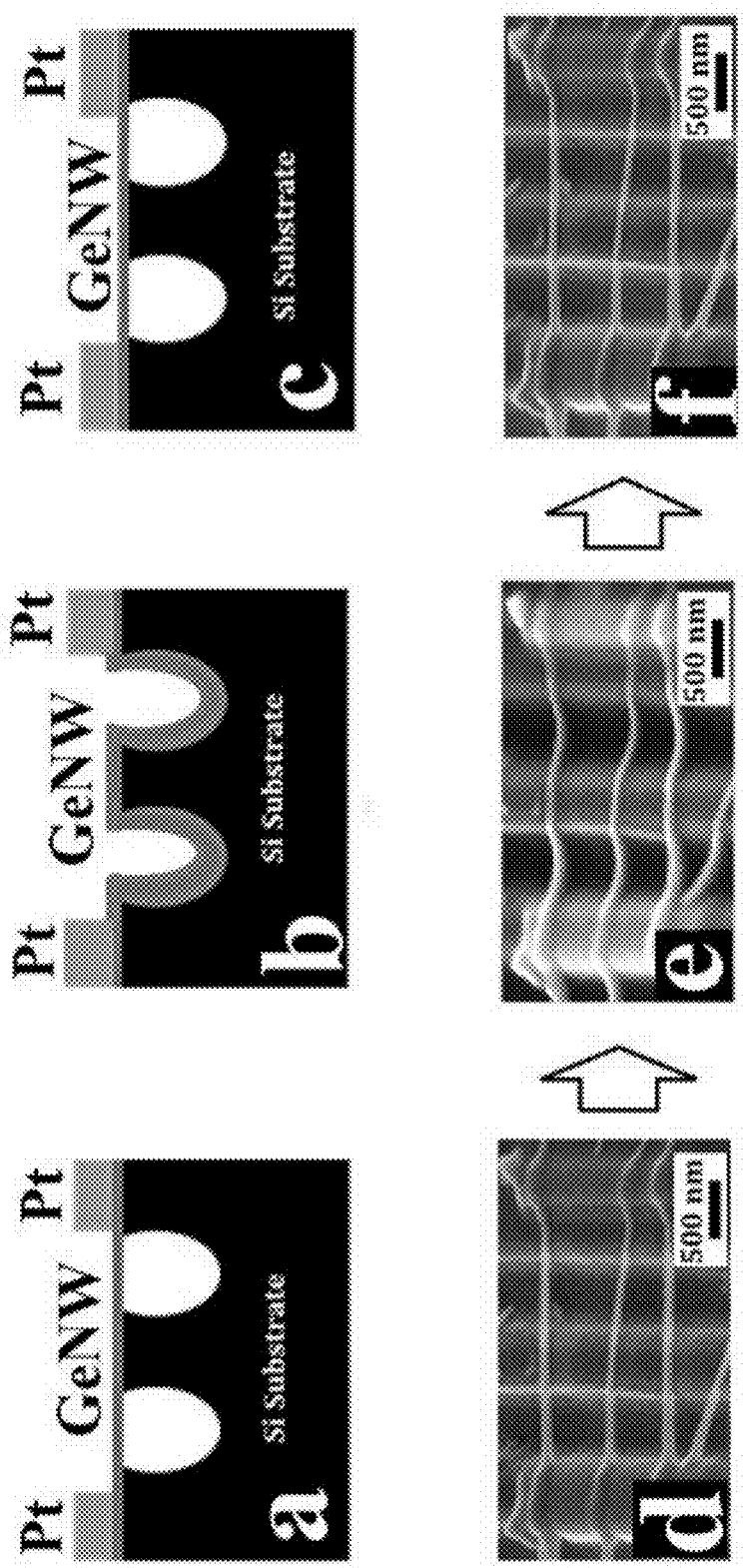
FIG. 9 includes various images indicating the effect of removing an optional polymer layer after performing LSSE on a patterned substrate comprising a germanium nanowire. Images (a), (b), and (c) schematically represent the nanowire before straining, after straining, and after dissolving the PVP, respectively. Images (d), (e), and (f) are FESEM images showing the nanowire before straining, after straining, and after dissolving the PVP, respectively.

FIGS. 6, 7, and 8 represent strain and deformation depth recorded at varying laser shock pressures (controlled via laser intensity), channel widths, and GeNW diameters, respectively. It was observed that deformation depth and average strain increase almost linearly, with the increase in laser shock pressure before nanowire fracture. Both bending strain (strain 1) and axial strain (strain 2) contributed to the total strain. Bending curvature was observed to decrease with increasing pressure. The smallest curvature attained before fracture commenced was approximately 450 nm. As represented in FIG. 7, an increase in the channel width induced higher strain in the system with an increase in both bending and axial strains. FIG. 8 indicates that the total strain does not change significantly with varying nanowire diameters. However, the contribution of bending and axial strains were affected with an increase in bending strain balanced by a decrease in the axial strain.

To investigate whether the laser shock induced shaping is elastic or plastic, samples were prepared wherein the PVP was dissolved in alcohol post-shaping. Imaging showed that the GeNWs were straightened post-dissolving of the PVP, indicating that the 3D straining was elastic in nature. Image (a), (b), and (c) schematically represent the nanowire before straining, after straining, and after dissolving the PVP, respectively. Images (d), (e), and (f) are FESEM images showing the nanowire before straining, after straining, and after dissolving the PVP, respectively. Platinum dots were fabricated on ends of the nanowires to constrain them. Images (c) and (f) indicate that the GeNWs were straightened after PVP was released. Thus, the GeNWs can be strained elastically at high strain rate by laser-induced shock pressure. This finding indicates that LSSE would be potentially valid for other semiconductor nanowires (SCNWs) as well.

Figure 10:
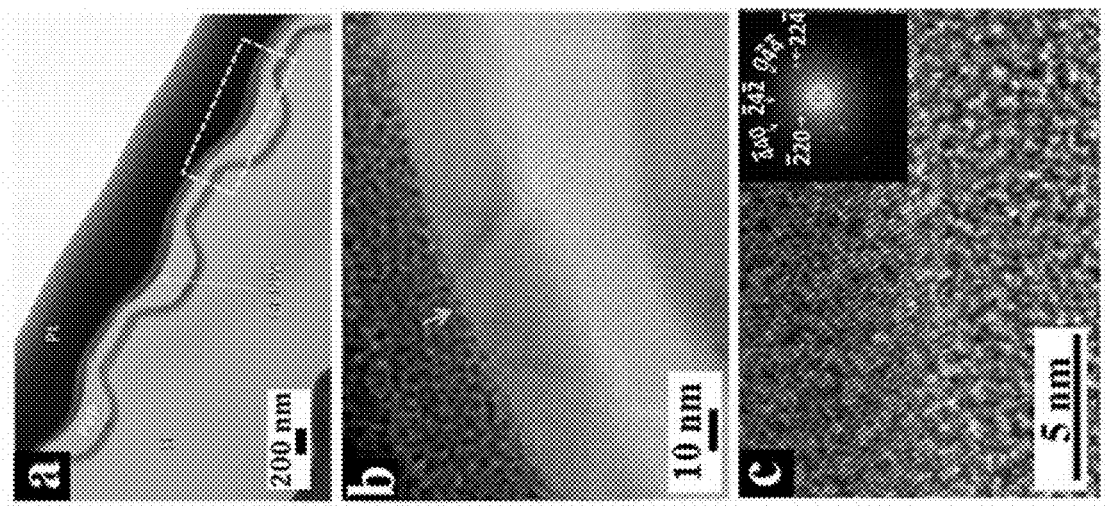
FIG. 10 includes three high resolution transmission electron microscopy (HRTEM) images of a cross-section of a germanium nanowire submerged inside a polymer layer subsequent LSSE. Image (b) is an enlarged view of the area enclosed in a dashed box in image (a), and image (c) is an enlarged view of the area indicated with an arrow in image (b).

Images (a), (b), and (c) of FIG. 10 are high resolution transmission electron microscopy (HRTEM) images of a cross-section of a representative GeNW submerged inside PVP. These images confirm the elastic nature of the straining. Image (c) shows Ge (221) crystalline planes, indicating that the GeNWs maintain their single crystal nature after the LSSE process, which can be seen from selected area electron diffraction of 3D shaped GeNWs (inset of image (c)).

These experimental investigations demonstrated that semiconducting nanowires can be controllably bent employing laser shock pressure. Remarkably, it was evidenced that the laser-induced strains were elastic in nature without disturbing the single crystal nature of the GeNWs.

In another experimental investigation, graphene was attached to $SiO_2$ substrates using an LSSE process (FIG. 1) and analyzed. To produce the test samples, graphene was transferred on to $SiO_2$ substrates by a wet chemical transfer process. The graphene was deformed by employing laser shock pressure on the graphene sheet stretched on the $SiO_2$ substrate. A pulsed (10 ns) Q-switch Nd:YAG laser (Continuum Surelite III, Wavelength: 1064 nm) was used as an energy source for ablation. The laser beam diameter of 4 mm was attained by a focusing lens, which was calibrated by a photosensitive paper (Kodak Linagraph, type: 1895). A glass slide was used as the confining media, and aerosol graphite painting (Asbury Carbons, U.S.A.) was coated on thin (4 μm) aluminum foil (Lebow Company Inc., Bellevue, Wash.) as the ablative layer. Laser scanning was enabled by placing the sample on an X-Y-Z computer controlled motorized stage. Silicon dioxide substrates with surface features were fabricated through electron beam lithography (EBL) or focused ion beam (FIB) milling. For the test samples discussed herein, a first substrate had a channel width of 400 nm and depth of 50 nm, and a second substrate had a channel width of 300 nm and a depth of 100 nm. The resulting samples obtained atomically smooth 3D shaped graphene indicating that the curvature of 3D shaped graphene can be precisely defined by substrate dimension and laser shock pressure.

Figure 11:
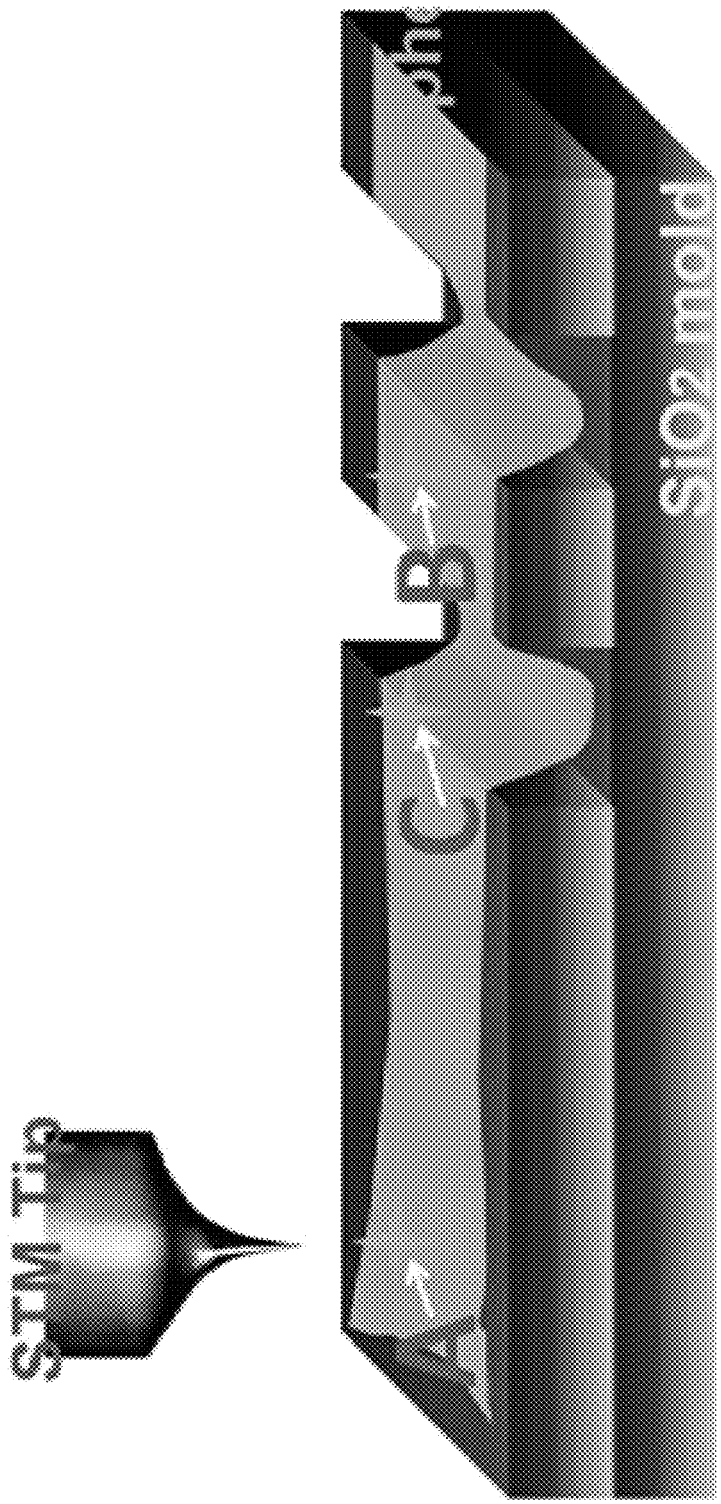
FIG. 11 schematically represents a variable-separation scanning tunneling spectroscopy (VS-STS) process used during investigations leading to certain aspects of the present invention. Differential conductance (dI/dV) was measured as a function of bias voltage at various locations on test samples. Three exemplary locations where measurements were obtained are indicated with the arrows labeled "A," "B," and "C."
Figure 12:
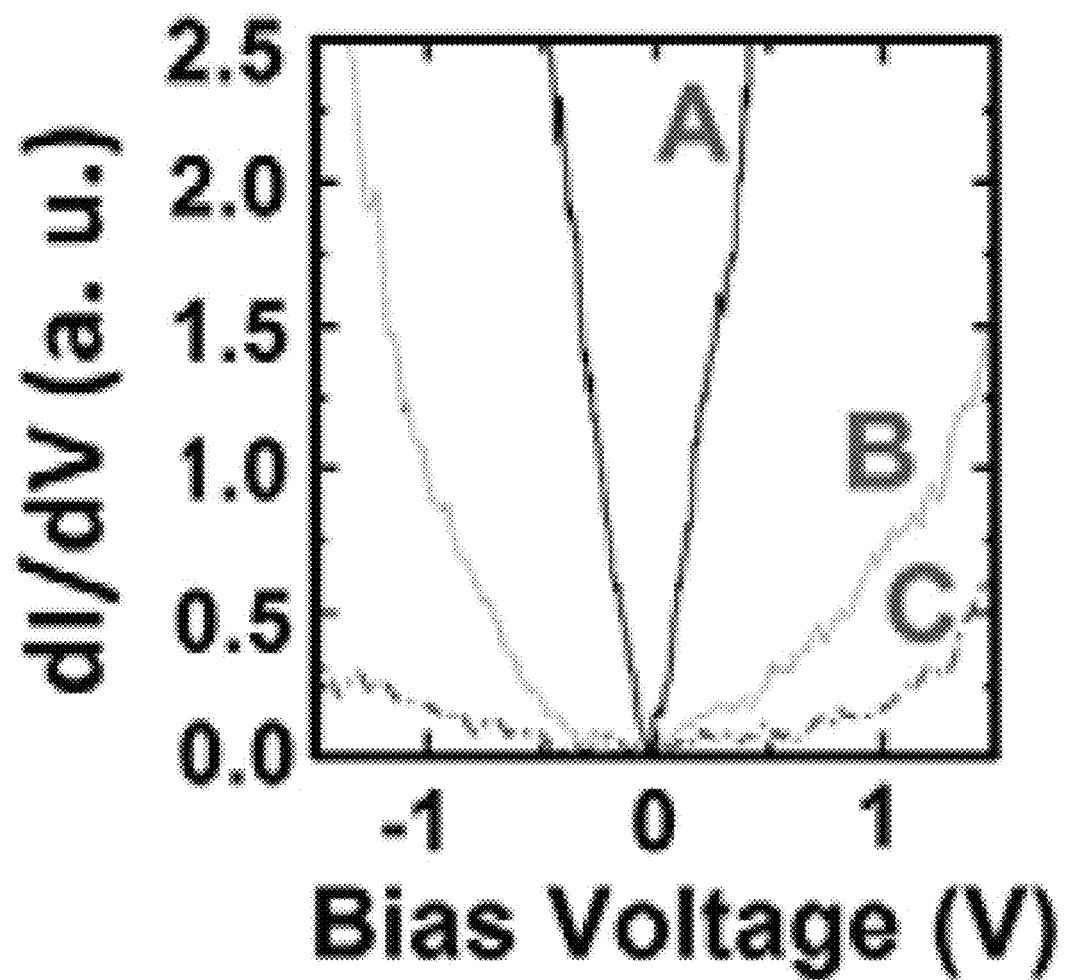
FIG. 12 is a plot representing differential conductance (dI/dV) measurements obtained for a test sample at locations corresponding to those labeled "A," "B," and "C" in FIG. 11.

To examine the influence of 3D local strain on the local electronic structure of the 3D strained graphene sheet, variable-separation scanning tunneling spectroscopy (VS-STS) was utilized. The differential conductance (dI/dV) was measured as a function of bias voltage at various locations on the samples. FIG. 11 schematically represents exemplary locations on the graphene where measurements were obtained. As represented in FIG. 12, the results show a band gap of zero for unstrained graphene on $SiO_2$ (labeled "A" in FIGS. 11 and 12), whereas an opening of the band gap is seen (indicated by negligible conductance in the vicinity of zero bias voltage) at the edge of the trench (labeled "C" in FIGS. 11 and 12) and in the region between trenches (labeled "B" in FIGS. 11 and 12).

Figure 13:
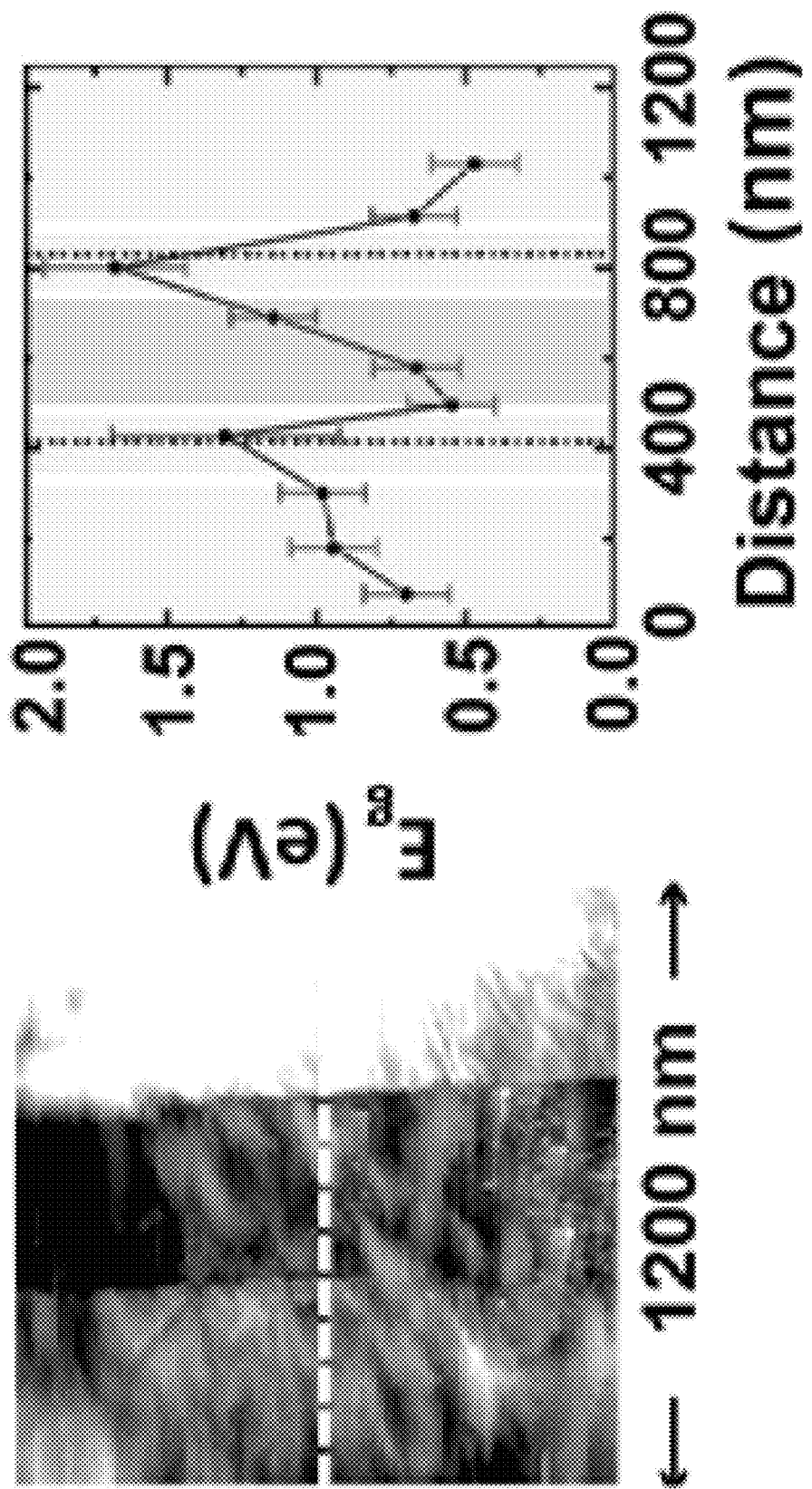
FIG. 13 includes a scanning tunneling microscopy (STM) image of graphene strained on a substrate having a channel having an arcuate cross-sectional shape (400 nm width and 50 nm depth; center of image), and a plot representing the corresponding effective band gaps of the graphene as a function of distance (nm) across the channel.

FIG. 13 includes a scanning tunneling microscopy (STM) image of graphene strained on a substrate having an arcuate-shaped channel with 400 nm width and 50 nm depth (center of image), and a plot representing the corresponding effective band gaps of the graphene as a function of distance (nm) across the channel. The highest effective band gaps, 1.3±0.38 eV and 1.7±0.24 eV, were observed at the edges of the trench, marked with the dashed lines (near 400 and 800 nm). On the other hand, smaller band gaps, ranging from 0.55±0.14 eV to 1.15±0.14 eV, were observed in the interior regions of the channel (e.g., about 500-700 nm).

It was observed that the edges of the channel exhibited mostly flat portions of the curve in VS-STS. Locations outside of the channel (e.g., about 0-300 and 700-1200 nm) registered band gaps in the range of 0.4 to 1.0 eV which is notable as graphene in these locations undergoes relatively lower levels of straining and of a purely elastic nature. Locations within the channel (e.g., about 500-700 nm) exhibit band gap in the range of 0.5-1.5 eV. These locations are under high strain. No plastic straining (i.e., disappearance of C-atoms) was observed for these locations. Achievement of band gap up to 1.0-1.5 eV with no chemical contamination and breakage of C—C bonds in graphene structure was a surprising result. Locations near the edges of the channel (e.g., about 400 and 800 nm) registered the highest measured electronic band gap in the range of 1.3 to 1.7 eV, which was believed to have partial contributions from elastic strains as well as partly due to disappearance of C-atoms (plastic strains). Even though plastic contribution is generally not desirable, the graphene maintained its skeleton in locations other than along the channel edge, which appeared to be under an acceptable tolerance level as paths for electronic transport were still available and thus electronic mobility would still be maintained.

Further investigations testing the effective band gaps of strained graphene located on substrates having different sized channels thereon resulted in various depths of deformation to the graphene. For example, a second substrate having a 300 nm width and 100 nm depth was 3D shaped to a depth of about 60 nm, whereas the graphene shown in FIG. 13 was only shaped to a depth of about 15 nm. Differential conductivity measurements indicated a significant difference between band gap plots of the samples. In general, central regions of the channels exhibited higher band gaps in deeper channels (e.g., 100 nm) relative to more shallow channels (e.g., 50 nm). It was believed that this result was due to deeper channels yielding higher levels of straining within the channels.

TEM imaging of a single layer of graphene strained on a $SiO_2$ substrate was used to analyze the carbon structures and measure atomic distances for strain assessment. It was observed that atoms in two directions were relatively closer than the equilibrium distance in graphene (i.e., hexagonal with 120 degree angles). At the same time, atomic distances were larger in the other directions. These results indicate nonuniform straining of the graphene, that is stretching in one direction and compression in another direction which induces shear strain and changes of angles in graphene structure. Such enhanced level of strain difference in different directions is expected to cause significant instability in the system and would raise potential energy and therefore would effectively locally open the band gap in graphene.

TEM imaging of multiple layers of graphene strained on a $SiO_2$ substrate indicated the presence of dislocations in the graphene, which would create local symmetry breakage and hence would cause significant local potential energy increases. Modeling simulations agreed with the experimental results.

This investigation indicated that the LSSE process involves bond stretching, bond curvature, opening β-angles, and shear strain. The high level of observed band gaps in the experiments were attributed to the combinations of these strain components available in 3D strained graphene. It is believed that shear strain is particularly crucial and when present with uniaxial strains provides synergistic effects that can yield significant band gap opening in graphene, particularly due to the shear strain breaking the lattice symmetry.

Strain tunable band gap was observed in graphene with the band gap value in about the 0.5-1.0 eV range in the central region of the channel and above 1.3 eV on edges thereof where axial contributions add up in special manner with shear. These results occurred without any chemical contamination. It is believed that similar results may be achieved with graphene lying on boron nitride, as boron nitride is currently believed to be the best substrate to retain mobility of a single layer graphene. Thus, a graphene/BN multilayer stack may be simultaneously 3D strained by laser shock.

In another experimental investigation, a monolayer of $MoS_2$ was attached to a $SiO_2/Si$ substrate using an LSSE process (FIG. 1) and then analyzed to investigate the strain engineering effects on low-temperature luminescence. The $MoS_2$ was wet transferred to the $SiO_2$ substrate having nanodots or nanogratings fabricated thereon by electron beam lithography of Hydrogen silsesquioxane (HSQ) resist. The sample was shocked with laser pressure, resulting in partial or full conformation to the underlying surface features. An initial tensile strain was introduced to the material at structured areas. The sample was analyzed to determine the effect of surface morphology in low-temperature luminescence. The results, discussed below, indicated shifts of the Raman spectra of $MoS_2$ on both flat and structured areas. The strain was released when the sample cooled down to low temperature.

Specifically, the sample was systematically characterized using scanning electron microscopy (SEM, Hitachi S-4800, acceleration voltage of 5 kV), Raman spectroscopy (Horiba, LabRAM HR-800, excitation light 633 nm), and atomic force microscopy (AFM, veeco Dimension 3100). The photoluminescence (PL) spectra were obtained on both the flat and structured areas of the $MoS_2$ monolayer at different temperatures ranging from 10 to 300 K. During the measurement, the sample was excited by a continuous-wave 532 nm laser beam which was focused to a 1.4 μm spot on the sample by a long working distance objective lens (50×, 0.55 NA). The same objective lens collected the PL signal which was analyzed by a spectrometer and recorded by a TEC cooled CCD camera. The sample was placed in a microscopy liquid helium cryostat so that the sample temperature could be varied.

Figure 14:
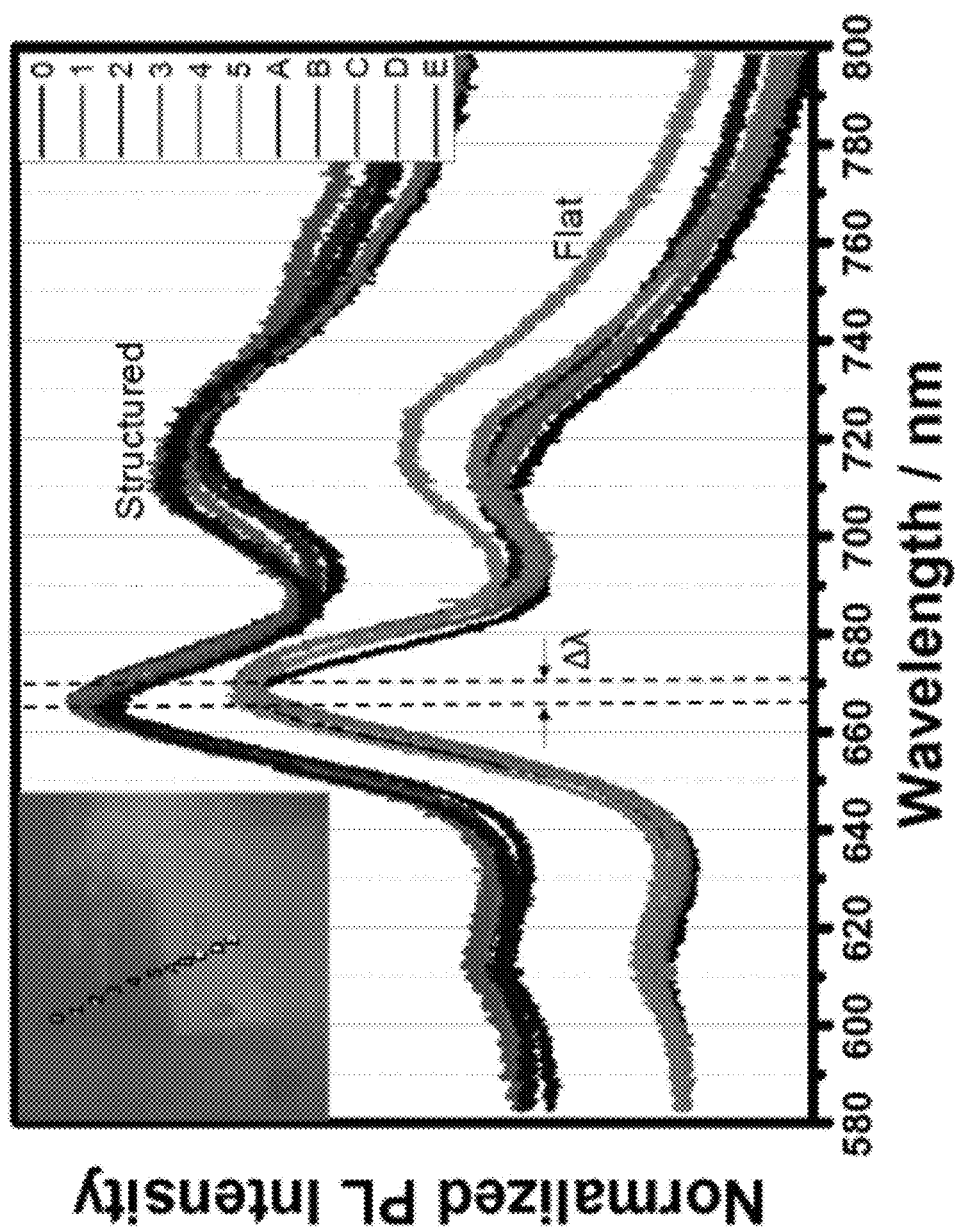
FIG. 14 is a plot representing experimental results of Raman spectroscopy performed on a test sample having a monolayer $MoS_2$ nanosheet strained over a patterned substrate. The plot represents differences of photoluminescence (PL) spectra obtained from flat and structured areas around a trench formed in the substrate at a temperature of 20 K. The spectra are normalized to one and offset vertically for clarity.

FIG. 14 represents differences of PL spectra obtained from the flat and structured areas at a low temperature of 20 K. The spectra are normalized to one and offset vertically for clarity. There are three peaks in the PL spectra. The middle peak corresponds to the A-exiton resonance. The peak on the shorter wavelength side is the B exciton resonance and the one on the longer wavelength side is the localized exciton resonance. As shown in FIG. 14, compared to the PL spectra from the flat areas, the spectra from the structured area display blue shifts for the A-exiton resonance and a stronger peak for the localized exciton resonance probed at a low temperature of 20 K. It was confirmed that the difference in the PL spectra between the flat and structured areas was not due to the variation in the sample location.

The observed blue shifts of A-exiton resonance on the structured areas were significantly different from those typically observed on partially suspended or fully conformal two-dimensional nanomaterials placed on three-dimensional surface features. Elastic tensile strains, rising from the van der Waals interactions of the two-dimensional nanomaterial and the 3D surface features, typically generate red shifts of the A-exiton resonance. However, the blue shifts observed at a low temperature from the laser shock transferred $MoS_2$ indicate that the thermal effect could significantly impact the electronic structure. It should be noted that monolayer h-$MoS_2$ has a positive thermal expansion coefficient ranging from $8*10^{-6}$ $K^{-1}$ at 300 K to around $1*10^{-6}$ $K^{-1}$ at 10 K. The substrate (amorphous $SiO_2$) has relatively small thermal expansion coefficient of $0.5*10^{-6}$ $K^{-1}$ at 300 K. The mismatch of the coefficients would generate a uniaxial tensile strain inside $MoS_2$.

Figure 15:
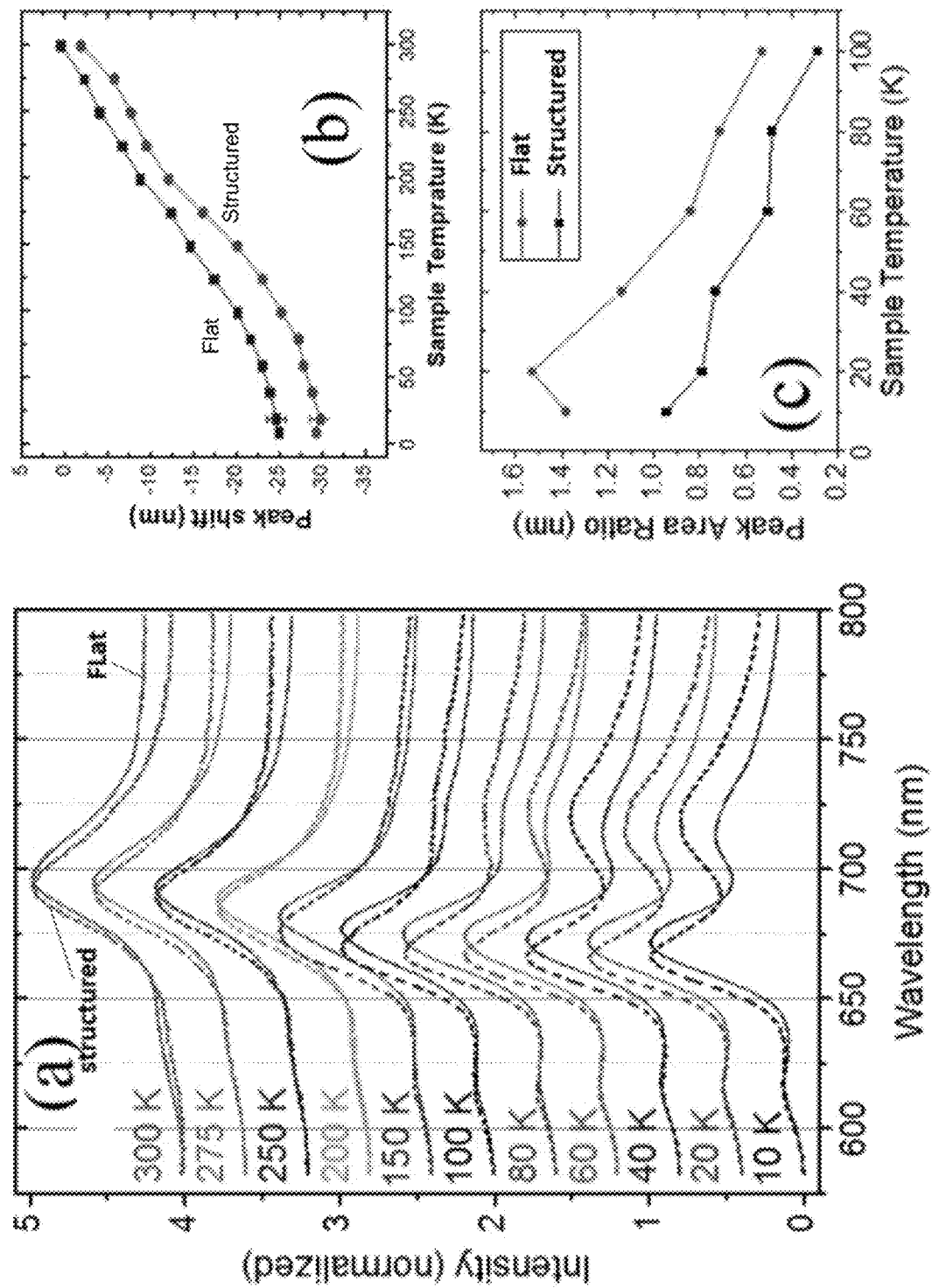
FIG. 15 includes plots representing experimentally measured optical properties of a monolayer $MoS_2$ nanosheet strained over a patterned substrate. Image (a) represents variation of the blue shifts as a function of temperature at flat and structured areas around a trench formed in the substrate. The solid lines are the PL spectra from the flat area and the dashed lines are the structured area. Image (b) represents the central wavelength of the peak shift of A-exciton resonance plotted as a function of temperature for both the structured and flat areas. The representative error bars are shown for the 20 K data. Image (c) represents the ratio of the peak areas of the localized exciton to the A-exciton as a function of temperature.

Image (a) of FIG. 15 represents variation of the blue shifts as a function of temperature in the 2D nanomaterial-3D surface feature system. The solid lines are the PL spectra from the flat area of the sample and the dashed lines are the structured area. The PL spectra at high temperatures include a broad peak. As the temperature decreases, the peak becomes narrower and two additional peaks appear. At all temperatures, the A-exiton resonances from the structured areas have systematical blue shifts from those at the flat areas. The peak intensity for the localized exciton resonance varies with the temperatures and is higher at low temperatures. By fitting the spectra to Gaussian peaks, related parameters could be extracted. Image (b) of FIG. 15 represents the central wavelength of the A-exiton resonance plotted as a function of temperature in for both the structured and flat areas. The representative error bars are shown for the 20 K data. The error bars are calculated from the spectra measured at multiple locations on the sample. The shift is about 5 nm at temperatures below 150 K and is larger than the variation at different locations on the sample. The blue shift increases as the temperature decreases. For the PL observed on surface features, there was a turning temperature (around 220 K) during the cooling process below which the shifts suddenly increase. Increased PL intensity of the localized exciton was also observed compared to the A-exiton, as shown in image (c) of FIG. 15 where the ratio of the peak areas of the localized exciton to the A-exiton is plotted as a function of the temperature.

To explain the observed PL shifts, especially the observed turning point of A-exiton resonances from the $MoS_2$ on surface features, molecular dynamics modeling of the interactions between $MoS_2$ and the 3D surface features was conducted. Numerical simulations of the laser shock straining process and subsequent relaxing through temperature variations offer the possibility of in-depth understanding of the 2D nanomaterial-substrate interactions at various temperatures. CVD-grown 2D nanomaterials, such as graphene and $MoS_2$, have inherent wrinkles or ripples due to the extremely low bending rigidity, different thermal expansion behavior with the growth substrate, and thermal instability. The substrate geometries, especially the finite radius of curvature at the structural edges, were found to significantly influence suspending behavior and strain levels of the 2D crystals.

The surface feature dimensions were found to introduce significant influences to the peak shifts. In particular, the peak shifts were strongly dependent on the aspect ratio (e.g. L/D; L being the period or characteristic length in the lateral direction and D being the depth) of the surface feature. As the length (L) was increased, the differences between the localized exciton resonances on flat and structured areas decreased. For the largest surface feature measured, no distinguishable peak shifts could be identified, and for the other smaller surface features, the peak shifts were obvious only at low temperatures. Simulations agreed with the experimental results.

These experiments indicated that the A-exiton resonance was highly dependent on the temperature and showed blue shifts when $MoS_2$ was on three-dimensional surface features, because of the mismatch of the thermal expansion coefficients of $MoS_2$ and the substrate. The relationship between resonance peak position and the temperature had a turning point, which through molecular dynamics modeling, is believed to occur due to material detaching from the sidewalls or complex surface geometries with the competing effect between elastic straining of the 2D nanomaterial and the van der Waals interaction from the substrate. This effect was highly dependent on the aspect ratios of the underlying substrate and it was minimal for large lateral length surface features.

As evidenced by the above investigations, LSSE provides a convenient method for controlling the deformation of a nanomaterial to tunably modify the shape of and one or more properties, such as band gap, of the nanomaterial. Control over the deformation of the nanomaterial may include fabricating a surface feature on a substrate to have specific predetermined dimensions and/or controlling the laser shock pressure applied to the nanomaterial. Controlling these variables provides for yielding a predetermined shape for the nanomaterial which may correspond to a predetermined property at or near the strained area of the nanomaterial.

LSSE processes provide means for tunably shaping 1D and 2D nanomaterials, allowing for control not only over structure, but also control over various properties of the nanomaterials, for example, electrical, chemical, and optical properties, via strain engineering. A particularly advantageous application of LSSE is believed to be the capability of inducing local strains in nanomaterials to control their electrical band gap. For example, controlling the periodicities and/or curvatures of nanowires formed of semiconductor materials can provide for predetermined band gaps in the nanowires via induced strain. Another application includes the capability of inducing local strains in nanomaterials to control their electron carrier mobility. Achieving such structures via LSSE is believed to be scalable, providing for the deformation of hundreds or thousands of nanowires simultaneously, relative to conventional methods that generally induce strain one nanowire at a time. A specific nonlimiting example includes using LSSE to increase the sensitivity of graphene on nanomaterials for surface enhanced raman spectroscopy (SERS) substrates for bio/chemical sensing.

These processes open the possibility of using strained nanomaterials in various electrical and optical devices, for example, sensors (optical, bio, chemical) and nanoelectronics. For example, strain engineered nanowires having tailored band gaps may be used as interconnects and/or functional material components in electrical devices. Strain engineered graphene (semiconducting graphene) could be used in field-effect transistors and optoelectronics, and could potentially replace silicon in the semiconductor industry. Strain engineered $MoS_2$ nanosheets could be used for highperformance field-effect transistors, supercapacitors, nonlinear optics, and flexible electronics and phototransistors. Products using LSSE produced strained nanomaterials could have significant effects on miniature devices, flexible electronics, and the semiconducting industry as a whole, particularly for components having semiconductor or conductive layers.

While the invention has been described in terms of specific or particular embodiments and investigations, it should be apparent that alternatives could be adopted by one skilled in the art. For example, the layer stack 10 and its individual layers could differ in appearance and construction from the embodiments described herein and shown in the drawings, process parameters such as laser beam intensity duration could be modified, and appropriate materials could be substituted for those noted. Accordingly, it should be understood that the invention is not necessarily limited to any embodiment described herein or illustrated in the drawings. It should also be understood that the phraseology and terminology employed above are for the purpose of describing the disclosed embodiments and investigations, and do not necessarily serve as limitations to the scope of the invention. Therefore, the scope of the invention is to be limited only by the following claims.

The invention claimed is:

1. A process comprising:
providing a substrate comprising a three-dimensional surface feature thereon formed, wherein the surface feature includes at least one dimension that is 100 nanometers or less;
locating a nanomaterial on the substrate and over the surface feature;
directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween; and
controlling the deformation of the nanomaterial to tunably modify a material property of the nanomaterial.

2. The process of claim 1, further comprising locating a metallic layer, an ablation layer, and a transparent confinement layer over the nanomaterial prior to directing the laser beam toward the nanomaterial, wherein the laser beam is directed through the transparent confinement layer to irradiate the ablation layer.

3. The process of claim 1, wherein the surface feature includes at least one dimension that is greater than 100 nanometers.

4. The process of claim 1, wherein the fabricating step is performed using electron beam lithography.

5. The process of claim 1, wherein the fabricating step is performed using focused ion beam (FIB) milling.

6. The process of claim 1, wherein the nanomaterial is any one chosen from the group consisting of a nanofiber, nanotube, nanowire, and nanorod.

7. The process of claim 6, wherein the nanomaterial is a germanium nanowire.

8. The process of claim 1, wherein the nanomaterial is any one chosen from the group consisting of a nanosheet, thin-film, and nanomembrane.

9. The process of claim 8, wherein the nanomaterial is graphene.

10. The process of claim 8, wherein the nanomaterial is a nanosheet formed of $MoS_2$.

11. A process comprising:
providing a substrate comprising a three-dimensional surface feature thereon formed;
locating a nanomaterial on the substrate and over the surface feature
directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween; and
controlling the deformation of the nanomaterial to tunably modify a material property of the nanomaterial, wherein the deformation is controlled to tunably modify an electrical band gap of the nanomaterial.

12. The process of claim 11, further comprising fabricating the surface feature on the substrate to have dimensions and applying laser shock pressure to a portion of the nanomaterial located adjacent to the surface feature to produce strains in the nanomaterial to yield an electrical band gap in the nanomaterial within or adjacent to the surface feature, wherein the strains produced in the nanomaterial are at least partially determined by the dimensions of the surface feature.

13. The process of claim 11, wherein the controlling step includes controlling the laser shock pressure applied to the nanomaterial at a location to deform and produce strains in the nanomaterial to yield an electrical band gap in the nanomaterial at the location.

14. The process of claim 1, further comprising controlling the deformation of the nanomaterial to tunably modify an optical property of the nanomaterial.

15. The process of claim 1, further comprising controlling the deformation of the nanomaterial to tunably modify a chemical property of the nanomaterial.

16. A process comprising:
providing a substrate comprising a three-dimensional surface feature thereon;
locating a one-dimensional nanomaterial on the substrate and over the surface feature;
directing a laser beam toward the nanomaterial such that the nanomaterial experiences laser shock pressure sufficient to deform the nanomaterial to conform at least partially to the shape of the surface feature and adhere to the surface feature either directly or via an intermediate layer therebetween without causing fracture in nanomaterial; and
controlling the deformation of the nanomaterial to tunably modify an electrical band gap of the nanomaterial, wherein the controlling step includes fabricating the surface feature on the substrate to have dimensions and applying laser shock pressure to a portion of the nanomaterial located adjacent to the surface feature to produce strains in the nanomaterial to yield an electrical band gap in the nanomaterial within or adjacent to the surface feature.

17. The process of claim 16, further comprising locating a metallic layer, an ablation layer, and a transparent confinement layer over the nanomaterial prior to directing the laser beam toward the nanomaterial, wherein the laser beam is directed through the transparent confinement layer to irradiate the ablation layer.

18. The process of claim 16, wherein the nanomaterial is any one chosen from the group consisting of a nanofiber, nanotube, nanowire, and nanorod.

19. The process of claim 16, wherein the surface feature includes at least one dimension that is 100 nanometers or less.

20. The process of claim 16, further comprising controlling the deformation of the nanomaterial to tunably modify a chemical, electrical, or optical property of the nanomaterial.

* * * * *